US011167446B2

(12) United States Patent
Yamamoto

(10) Patent No.: US 11,167,446 B2
(45) Date of Patent: Nov. 9, 2021

(54) WORKPIECE PROCESSING METHOD

(71) Applicant: DISCO CORPORATION, Tokyo (JP)

(72) Inventor: Naoko Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/165,163

(22) Filed: Feb. 2, 2021

(65) Prior Publication Data

US 2021/0252742 A1 Aug. 19, 2021

(30) Foreign Application Priority Data

Feb. 14, 2020 (JP) .............................. JP2020-023126

(51) Int. Cl.
| | | |
|---|---|---|
| B29C 65/00 | (2006.01) | |
| B28D 5/00 | (2006.01) | |
| H01L 21/683 | (2006.01) | |
| B28D 5/04 | (2006.01) | |
| B29C 65/76 | (2006.01) | |
| B29C 65/78 | (2006.01) | |
| B29C 65/48 | (2006.01) | |
| B29C 65/50 | (2006.01) | |
| B29C 65/74 | (2006.01) | |

(52) U.S. Cl.
CPC ......... *B28D 5/0082* (2013.01); *B28D 5/0076* (2013.01); *B28D 5/04* (2013.01); *H01L 21/6836* (2013.01); *B29C 65/00* (2013.01); *B29C 65/48* (2013.01); *B29C 65/50* (2013.01); *B29C 65/741* (2013.01); *B29C 65/76* (2013.01); *B29C 65/7805* (2013.01); *B29C 65/7817* (2013.01); *H01L 2221/68327* (2013.01)

(58) Field of Classification Search
CPC ......... B29C 65/00; B29C 65/48; B29C 65/50; B29C 65/741; B29C 65/76; B29C 65/7805; B29C 65/7817
See application file for complete search history.

(56) References Cited

U.S. PATENT DOCUMENTS

| | | | | |
|---|---|---|---|---|
| 6,309,943 B1 * | 10/2001 | Glenn | ................... | H01L 21/481 257/E23.179 |
| 2001/0041387 A1 * | 11/2001 | Tateiwa | ................. | B28D 5/022 438/114 |
| 2002/0076848 A1 * | 6/2002 | Spooner | .............. | B81C 1/00896 438/48 |
| 2004/0259332 A1 * | 12/2004 | Fukuoka | ............... | B24B 41/068 438/464 |
| 2005/0037541 A1 * | 2/2005 | Nagasawa | ............. | H01L 21/304 438/113 |
| 2007/0023136 A1 * | 2/2007 | Priewasser | .............. | H01L 21/78 156/272.8 |
| 2007/0066188 A1 * | 3/2007 | Nitta | ................. | H01L 21/67092 451/41 |

(Continued)

FOREIGN PATENT DOCUMENTS

JP 2016046485 A 4/2016

*Primary Examiner* — Mark A Osele
*Assistant Examiner* — Nickolas R Harm
(74) *Attorney, Agent, or Firm* — Greer Burns & Crain Ltd.

(57) ABSTRACT

A processing method for a workpiece includes a cutting step of cutting the workpiece along streets by a cutting blade having a V-shaped tip end, to form V grooves of which shallower parts are wider than deeper parts, and a cleaning step of cleaning a back surface of the workpiece with cleaning water, after the cutting step is carried out.

1 Claim, 13 Drawing Sheets

(56) References Cited

U.S. PATENT DOCUMENTS

| | | | |
|---|---|---|---|
| 2007/0093040 A1* | 4/2007 | Sekiya | H01L 25/0657 438/460 |
| 2007/0123002 A1* | 5/2007 | Norimoto | H01L 21/67132 438/464 |
| 2007/0275541 A1* | 11/2007 | Harris | H01L 21/78 438/460 |
| 2008/0121906 A1* | 5/2008 | Yakushiji | H01L 33/0095 257/94 |
| 2009/0186465 A1* | 7/2009 | Fujisawa | H01L 21/78 438/462 |
| 2011/0012258 A1* | 1/2011 | Omandam | B23K 26/0006 257/737 |
| 2015/0037915 A1* | 2/2015 | Lei | B23K 26/046 438/16 |
| 2016/0346956 A1* | 12/2016 | Takekawa | B23Q 17/10 |
| 2019/0122928 A1* | 4/2019 | Norimoto | H01L 21/268 |
| 2020/0215649 A1* | 7/2020 | Genda | B23K 26/0665 |
| 2020/0266047 A1* | 8/2020 | Kataoka | H01L 21/02354 |

\* cited by examiner

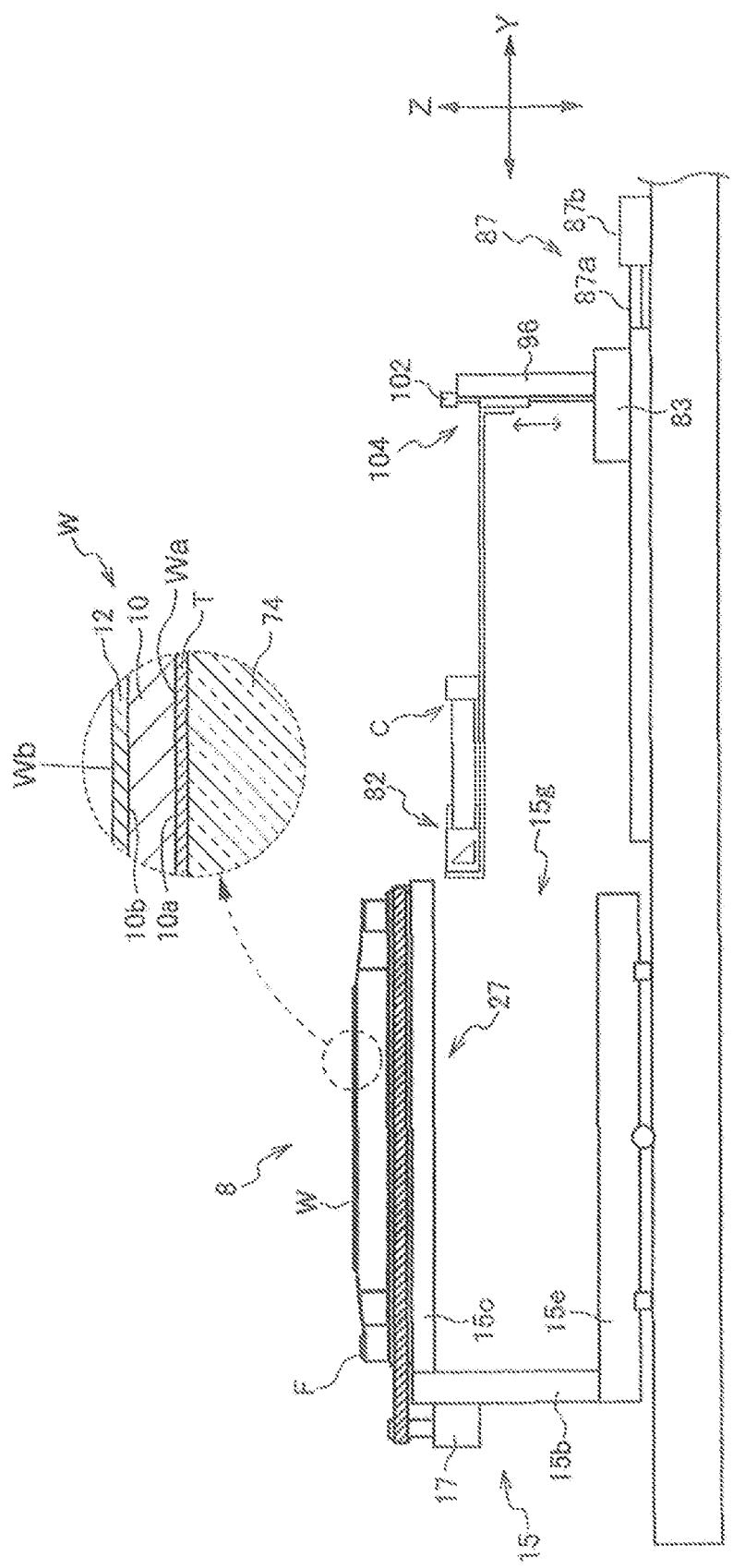

WORKPIECE PROCESSING METHOD

BACKGROUND OF THE INVENTION

Field of the Invention

The present invention relates to a processing method for a workpiece having on a front surface thereof devices formed respectively in regions partitioned by a plurality of intersecting streets.

Description of the Related Art

Conventionally, there has been known a cutting apparatus for cutting a workpiece, which is a semiconductor wafer having a front surface formed with devices respectively in regions partitioned by a plurality of intersecting streets, along the streets by a cutting blade rotated at high speed.

For example, Japanese Patent Laid-open No. 2016-46485 discloses a cutting apparatus including a chuck table that holds a wafer unit, a cutting unit that cuts a wafer, and a cleaning unit that cleans the wafer. In this kind of cutting apparatus, the wafer is cleaned by the cleaning unit after cut grooves are formed in the wafer by cutting.

The cleaning unit is configured to jet a cleaning liquid from a cleaning liquid jetting nozzle positioned on an upper side of the wafer, while holding the wafer and rotating the wafer at high speed by a spinner table mechanism. Such a cleaning method is called spin cleaning, by which cutting swarf (foreign matter, contaminants) adhered to the wafer in the cutting step is removed.

SUMMARY OF THE INVENTION

In the abovementioned spin cleaning, since the cleaning liquid is supplied from the upper side of the rotating workpiece, it is difficult for the cleaning liquid to enter into the cut grooves, and the cutting swarf having entered into the cut grooves may be left in the cut grooves without being washed away.

The cutting swarf would be left adhering to side surfaces of chips, after the wafer is later divided along the streets and individualized into the chips. Then, the cutting swarf may drop, for example, at the time of picking up the chip, to adhere to the devices, whereby the devices may be damaged, leading to a trouble such as defects in the devices.

Accordingly, it is an object of the present invention to provide a processing method which includes a cutting step of forming cut grooves and a cleaning step of performing spin cleaning thereafter, and by which cutting swarf generated in the cutting step is washed away more securely and the cutting swarf is prevented from being left as it is.

In accordance with an aspect of the present invention, there is provided a processing method for a workpiece having a front surface formed with devices respectively in regions partitioned by a plurality of intersecting streets. The processing method includes a workpiece preparation step of adhering a tape transparent to visible light to the front surface of the workpiece, a holding step of holding the front surface side of the workpiece through the tape by a holding table having a holding member of which at least a part is transparent, a street position detection step of imaging the front surface of the workpiece held by the holding table through the holding member and the tape by an imaging camera to detect a position of the street, after the holding step is carried out, a cutting step of cutting a back surface of the workpiece along the streets by a cutting blade having a V-shaped tip end, to form V grooves of which shallower parts are wider than deeper parts, after the street position detection step is carried out, and a cleaning step of cleaning the back surface of the workpiece with a cleaning liquid, after the cutting step is carried out.

According to the present invention, the grooves of which shallower parts are wider than deeper parts are formed. Therefore, the cleaning liquid easily enters into the grooves in the cleaning step, so that cutting swarf having entered into the grooves can be securely washed away, and the cutting swarf can be prevented from remaining on side surfaces and back surfaces of the chips. In addition, a status in which the cutting liquid having entered into the grooves is also easily discharged together with the cutting swarf can be realized.

The above and other objects, features and advantages of the present invention and the manner of realizing them will become more apparent, and the invention itself will best be understood from a study of the following description and an appended claim with reference to the attached drawings showing some preferred embodiments of the invention.

BRIEF DESCRIPTION OF THE DRAWINGS

FIG. 4 is a diagram depicting a sectional shape of the holding table and the like;

FIG. 8 is a partially sectional side view depicting a positional relation between the holding table and the lower imaging mechanism;

DETAILED DESCRIPTION OF THE PREFERRED EMBODIMENTS

Figure 1:
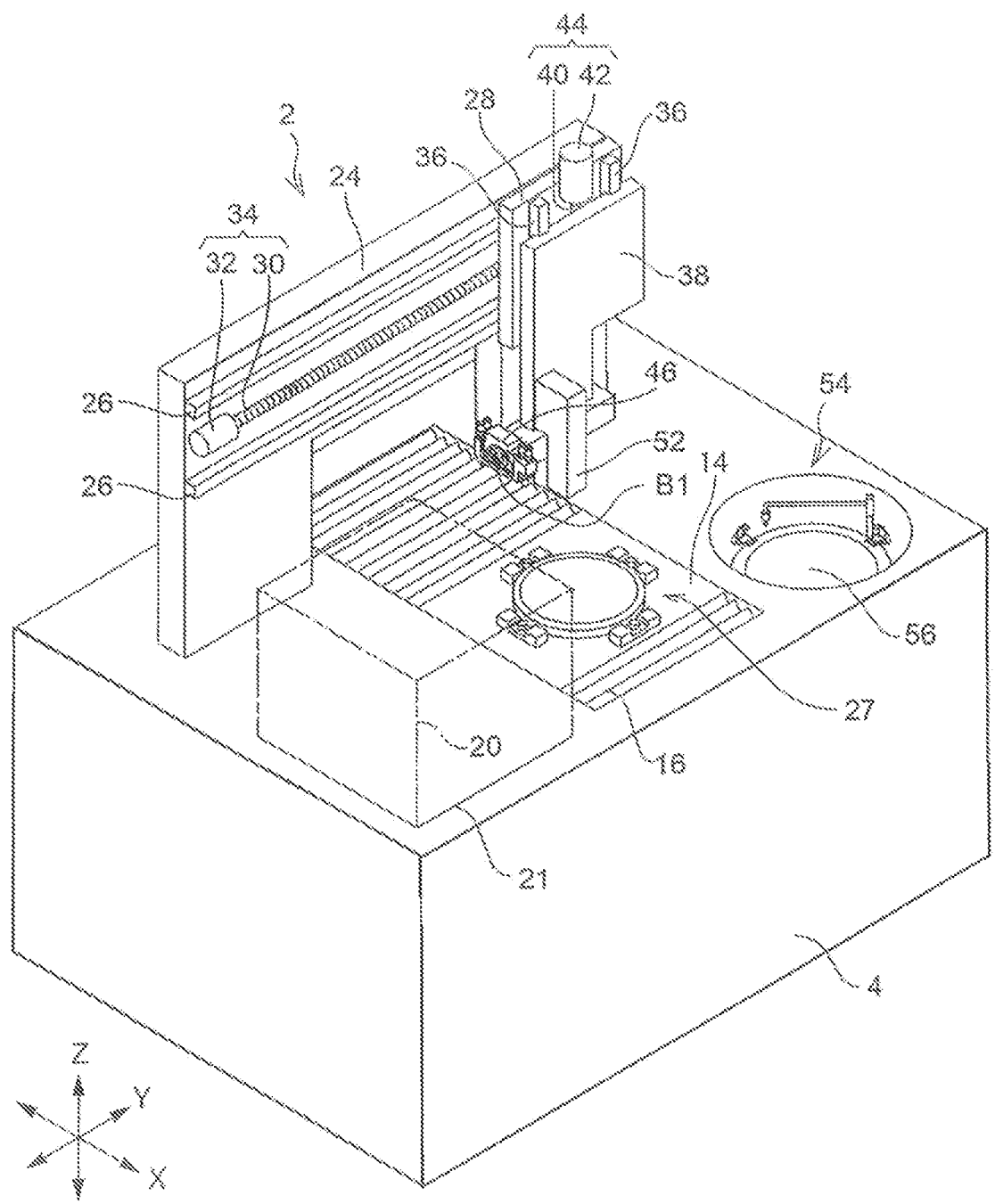
FIG. 1 is a perspective view of a first embodiment of a cutting apparatus to be used in carrying out the present invention.

An embodiment of the present invention will be described in detail below referring to the drawings. FIG. 1 is a perspective view depicting a cutting apparatus 2 according to one embodiment of the present invention. Note that the present invention is applicable not only to the cutting apparatus described below but also to a laser processing apparatus having a processing unit which processes a workpiece by a laser beam and which includes a laser oscillator for oscillating a laser and a light concentrator for concentrating the laser beam on the workpiece.

Figure 3A:
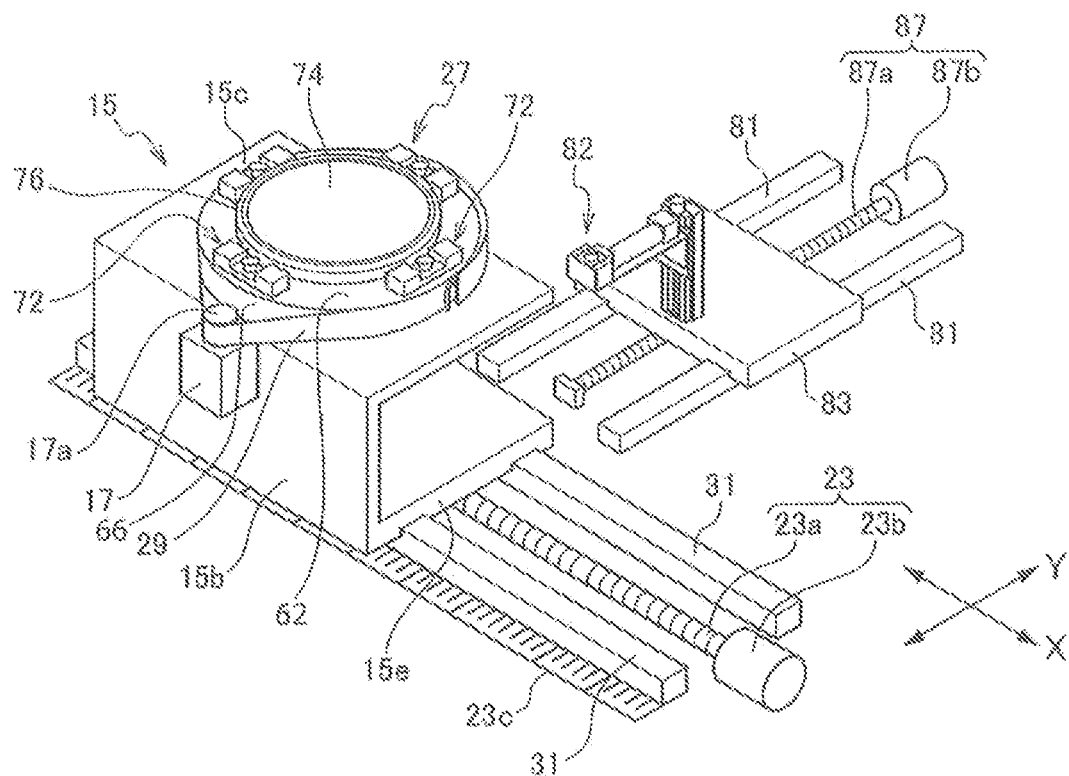
FIG. 3A is a perspective view of a holding table mounted on the support box.

As depicted in FIG. 1, a holding table 27 is disposed on a base 4 of the cutting apparatus 2 such as to be reciprocatable in an X-axis direction by a moving mechanism 23 (FIG. 3A). A water cover 14 is disposed in the vicinity of the holding table 27, and a bellows 16 is connected ranging between the water cover 14 and the base 4. A cassette mount base 21 for mounting thereon a cassette 20 which accommodates workpieces described later is provided at a frontside corner part of the base 4.

A gate-shaped column 24 is erected on the base 4, and a pair of guide rails 26 extending in a Y-axis direction are fixed to the column 24. A Y-axis moving block 28 is provided to be movable relative to the guide rails 26, and the Y-axis moving block 28 is moved in the Y-axis direction by a Y-axis moving mechanism 34 including a ball screw 30 and a pulse motor 32, while being guided by the guide rails 26.

As depicted in FIG. 1, a pair of guide rails 36 extending in a Z-axis direction are fixed to the Y-axis moving block 28. A Z-axis moving block 38 is provided to be movable relative to the guide rails 36, and the Z-axis moving block 38 is moved in the Z-axis direction by a Z-axis moving mechanism 44 including a ball screw 40 and a pulse motor 42, while being guided by the guide rails 36.

Figure 9:
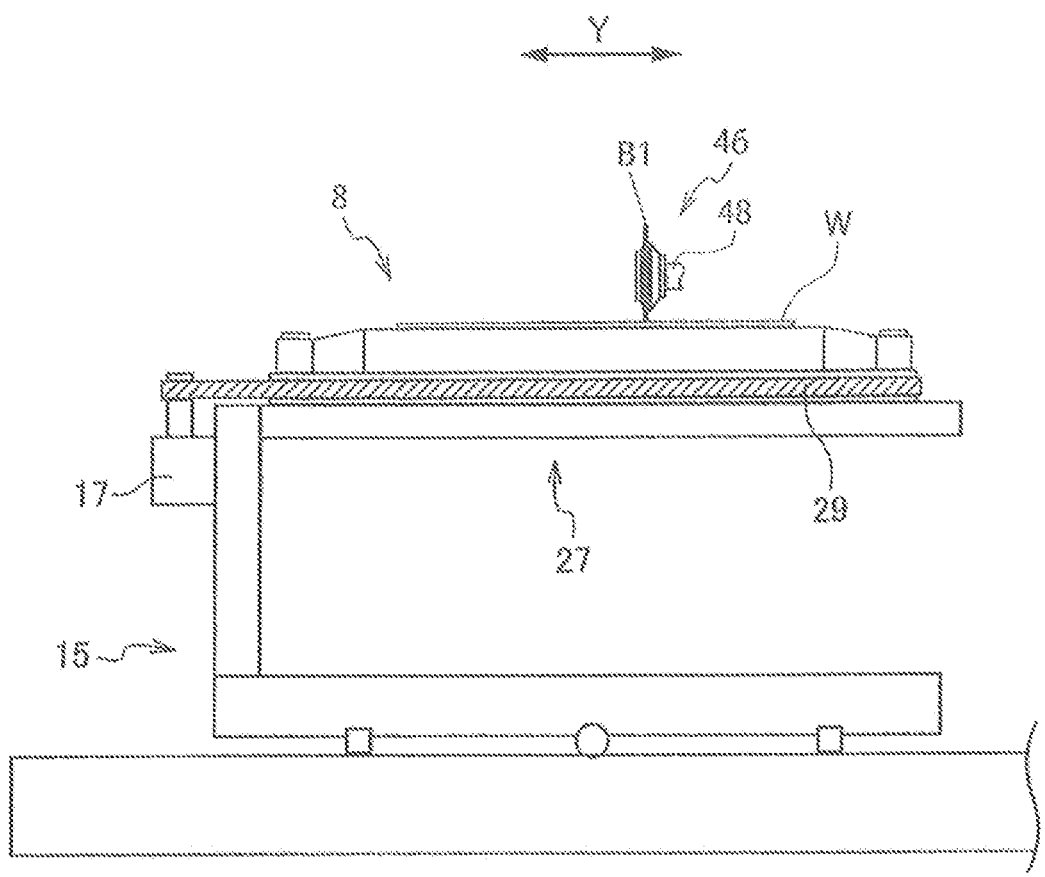
FIG. 9 is a partially sectional side view for explaining a cutting step.

A cutting unit 46 and an upper imaging mechanism 52 are attached to the Z-axis moving block 38. As depicted in FIG. 9, the cutting unit 46 has a configuration in which a cutting blade B1 is detachably mounted to a tip end portion of a spindle 48 rotationally driven by an unillustrated motor.

As depicted in FIG. 1, a spinner cleaning unit 54 having a spinner table 56 is provided on the base 4, such that a workpiece being cut can be suction held by the spinner table 56, spinner cleaned, and spin dried.

Figure 2:
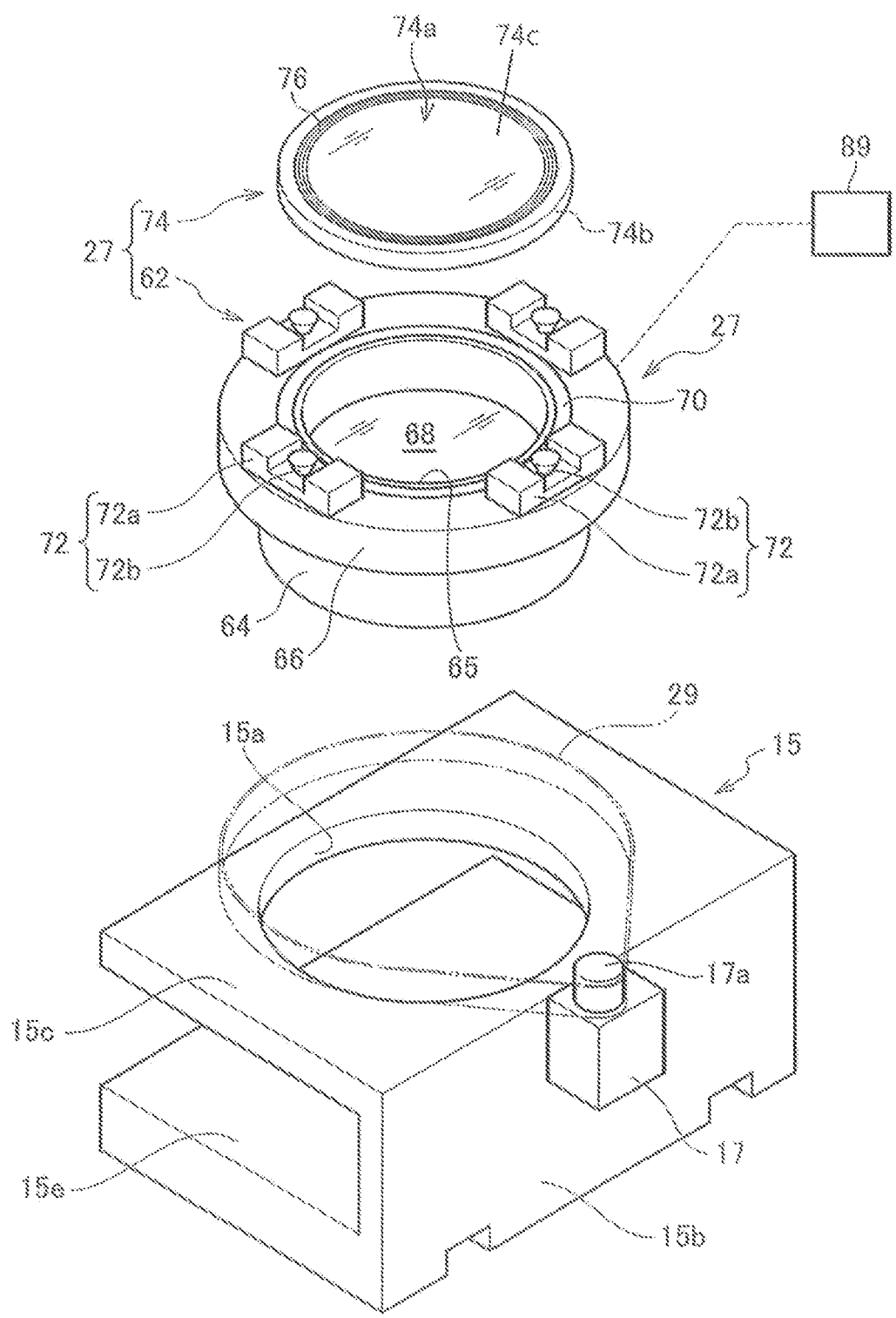
FIG. 2 is an exploded perspective view of a support box and a holding table part.

FIG. 2 is a diagram for explaining the configuration of the holding table 27. The holding table 27 has an annular base 62 and a disk-shaped holding member 74. The annular base 62 has a fitting section 64, a belt winding section 66 larger than the fitting section 64 in diameter, a penetrating section 65 penetrating the fitting section 64 in an axial direction, and a transparent member 68 closing the penetrating section 65. As depicted in FIG. 2, an upper surface of the annular base 62 is provided with a mounted region 70 for mounting and fixing thereon a frame section 74b of the disk-shaped holding member 74.

As depicted in FIG. 2, the holding member 74 includes a disk-shaped holding section 74a, and the frame section 74b surrounding the periphery thereof. The holding section 74a includes a transparent member such as quartz glass, borosilicate glass, sapphire, calcium fluoride, lithium fluoride, and magnesium fluoride. Note that "transparent" of the transparent member means "to transmit, but not to absorb or scatter, light of at least a part of wavelengths of visible light," and the transparent member may be any member that enables performance/execution of a peripheral projected part detection step and a street position detection step described later and may be a colored one. In addition, a transparent region may be configured in only a partial required region of the holding member 74. In such a way, a transparent region is configured in the holding table 27 by the holding section 74a of the holding member 74.

Figure 4:
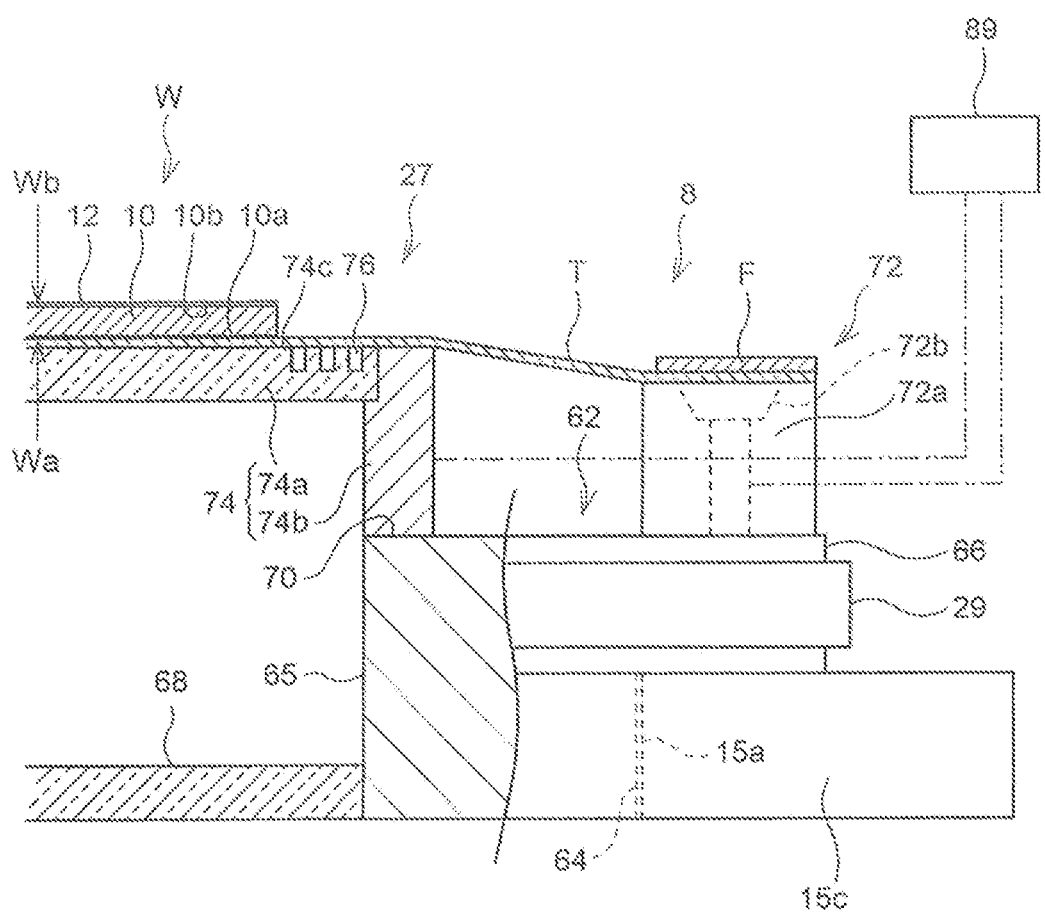

As depicted in FIG. 4, an upper surface of the holding section 74a forms a holding surface 74c for holding a wafer W. A plurality of (in the present embodiment, three) annular suction grooves 76 are provided concentrically at a part near a peripheral edge of the holding section 74a, and a tape T is suction held on the suction grooves 76. The suction grooves 76 are connected to a suction source 89 in a state in which the holding member 74 is attached to the annular base 62.

As depicted in FIGS. 2 and 4, frame support sections 72 that support an annular frame F of a wafer unit 8 from the lower side are provided at four locations on an upper surface of the annular base 62 in such a manner as to surround the holding member 74.

The frame support section 72 has a support block 72a constituting a support surface for supporting the annular frame F, and a suction section 72b for suction holding the annular frame F from the lower side, and the suction section 72b is connected to the suction source 89.

The annular base 62 of the holding table 27 is formed with a penetrating section 65 substantially equal in diameter to the holding section 74a of the holding member 74, and a lower part of the penetrating section 65 is closed with the transparent member 68 (for example, glass). As a result, the transparent member 68, the penetrating section 65, and the holding section 74a of the holding member 74 are arranged in this order from the lower side, and, with light transmitted through these parts, imaging from below the holding table 27 is possible, as will be described later. Note that the transparent member 68 may be omitted.

As depicted in FIG. 2, with the holding member 74 mounted on the mounted region 70 of the annular base 62, and with the annular fitting section 64 projected downward from the annular base 62 to be fitted to a circular opening 15a of the support box 15, a state in which the holding table 27 is rotatably mounted on the support box 15 as depicted in FIG. 3A is obtained.

As depicted in FIG. 3A, a motor 17 is attached to a connection plate 15b of the support box 15, and a belt 29 is wrapped around a pulley 17a connected to an output shaft of the motor 17 and the belt winding section 66 of the annular base 62. When the motor 17 is driven, the holding table 27 is rotated through the belt 29.

Figure 7A:
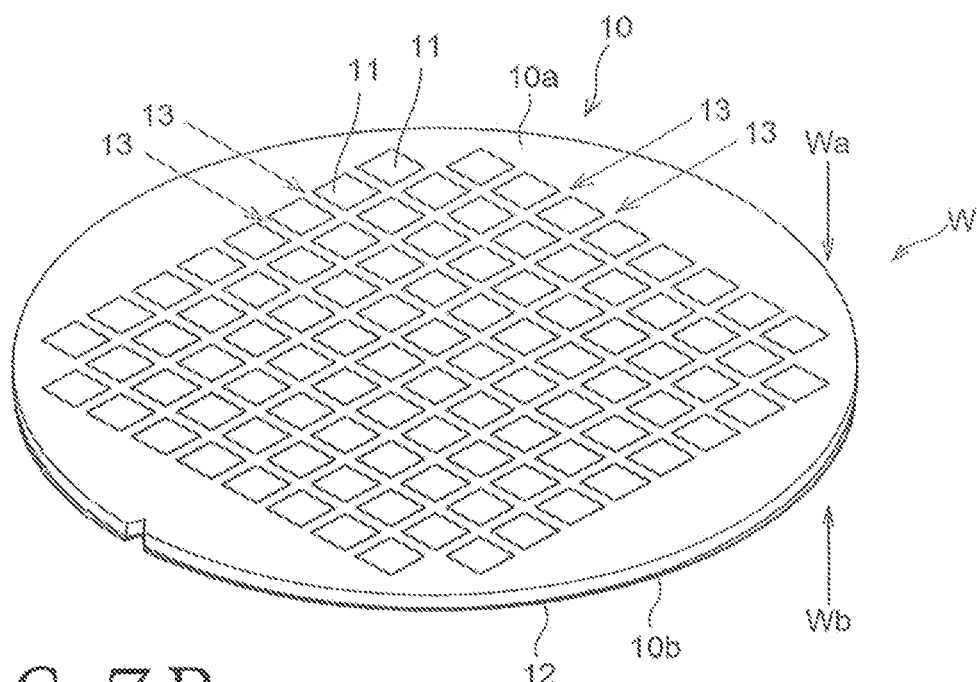
FIG. 7A is a perspective view depicting a front surface of a wafer as an example of a workpiece.

The motor 17 depicted in FIG. 3A includes, for example, a pulse motor, and, when the motor 17 is driven by predetermined pulses at the time of performing alignment, the holding table 27 is rotated by a predetermined amount (θ rotation), whereby alignment of the streets 13 of the wafer W depicted in FIG. 7A can be performed.

As depicted in FIG. 3A, the support box 15 is slidably mounted on a pair of guide rails 31 extending in a fixed manner in the X-axis direction and is moved in the X-axis direction by the moving mechanism 23. The moving mechanism 23 includes a ball screw 23a disposed between the guide rails 31 in parallel to the latter, and a pulse motor 23b.

The ball screw 23a is screw engaged with a female screw section provided at a lower surface of a lower plate 15e of the support box 15, and, with the ball screw 23a rotated by driving the pulse motor 23b, the support box 15 is moved in the X-axis direction.

A lower imaging mechanism 82 that images the workpiece such as a semiconductor wafer held by the holding table 27 from the lower side of the holding member 74 is provided in the vicinity of the support box 15.

As depicted in FIG. 8, the support box 15 is substantially U-shaped in side view and includes an upper plate 15c, a lower plate 15e, and a connection plate 15b, and, on the side opposite to the connection plate 15b, there is provided an opening 15g permitting the lower imaging mechanism 82 to enter into a space between the upper plate 15c and the lower plate 15e.

Figure 3B:
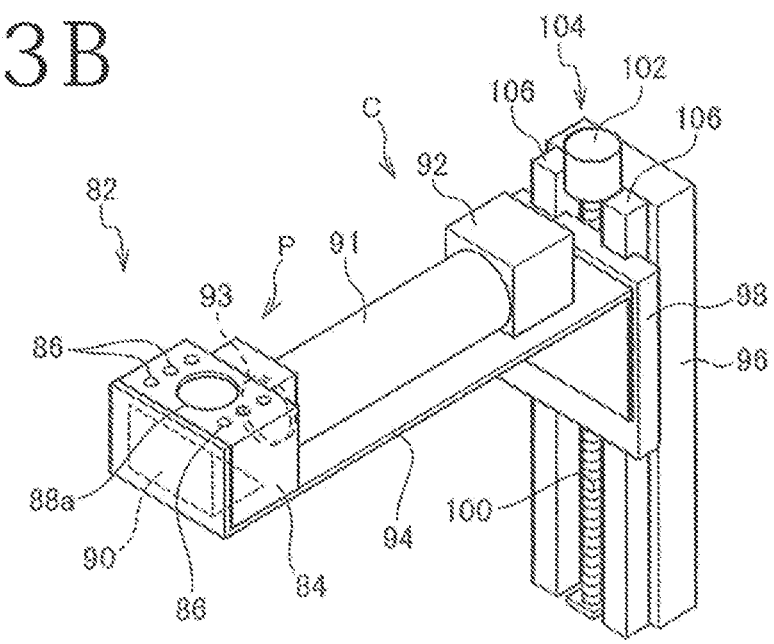
FIG. 3B is a perspective view of a lower imaging mechanism and a support structure thereof.

As depicted in FIGS. 3A and 3B, the lower imaging mechanism 82 is provided on a column 96 erected on the Y-axis moving block 83. The Y-axis moving block 83 is slidably mounted on a pair of guide rails 81 extending in a fixed manner in the Y-axis direction and is driven in the Y-axis direction by driving means 87. The driving means 87 includes a ball screw 87a disposed between the guide rails 81 in parallel to the latter, and a pulse motor 87b.

As depicted in FIG. 3A, the ball screw 87a is screw engaged with a female screw section provided at a lower surface of the Y-axis moving block 83, and, with the ball screw 87a rotated by driving the pulse motor 87b, the Y-axis moving block 83 is moved in the Y-axis direction. As depicted in FIG. 3B, the lower imaging mechanism 82 includes a prism mechanism P and an imaging camera C.

Figure 5A:
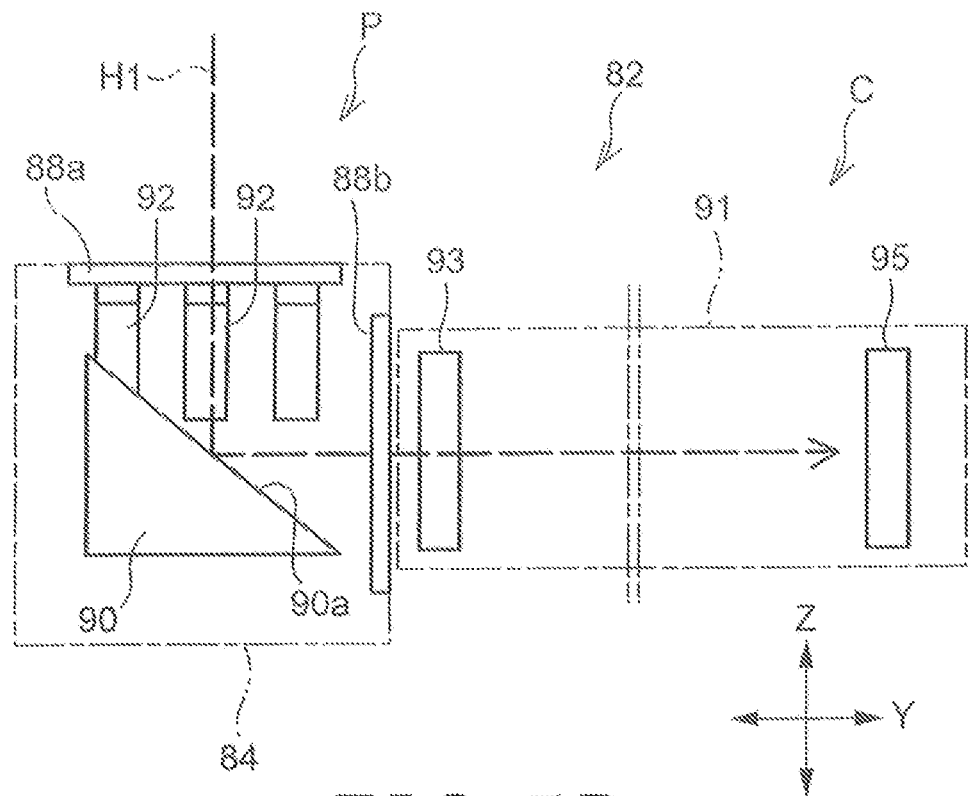
FIG. 5A is a schematic side view depicting a configuration of the lower imaging mechanism.
Figure 6:
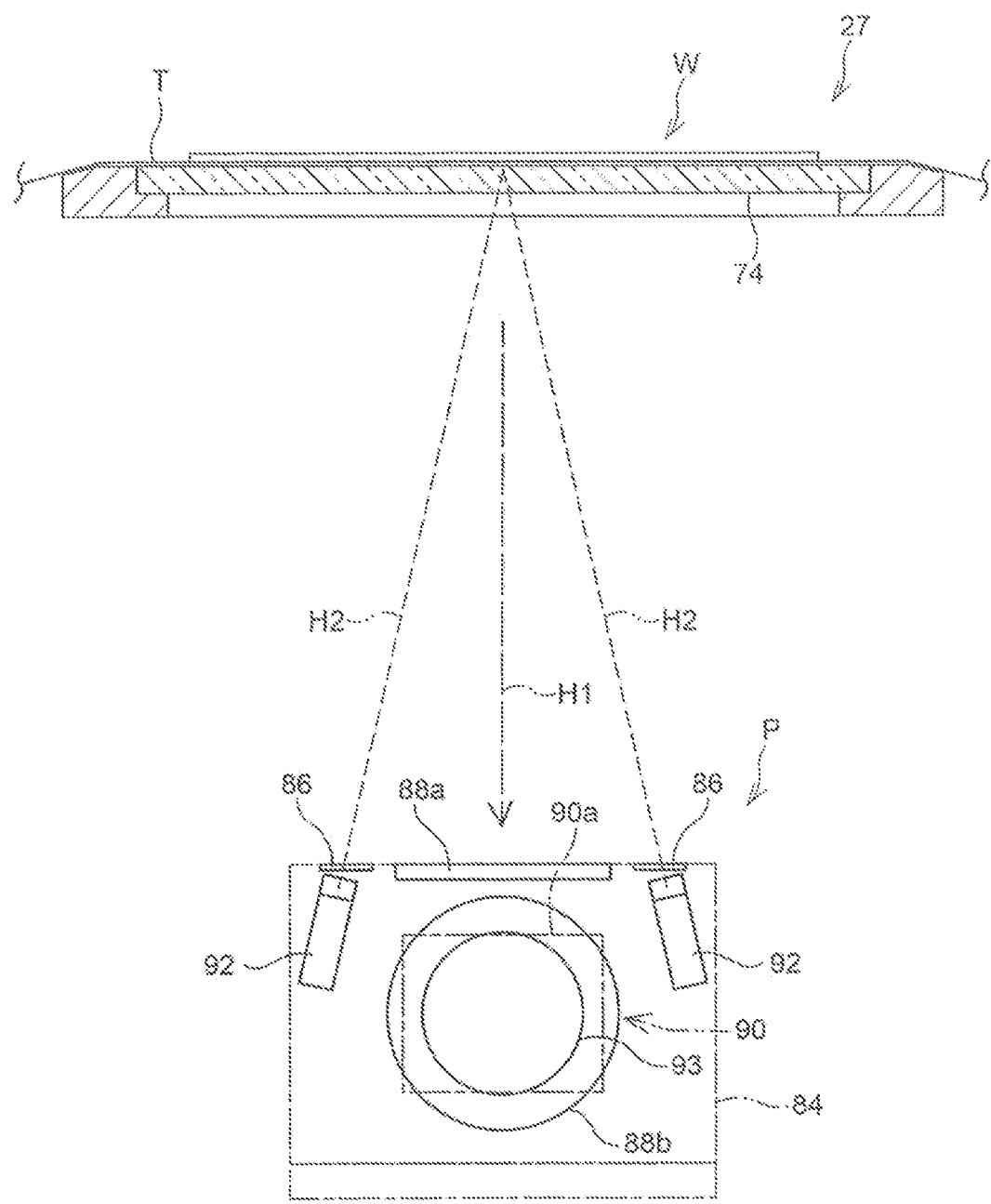
FIG. 6 is a schematic front view depicting the configuration of the lower imaging mechanism.

As depicted in FIGS. 5A and 6, the prism mechanism P includes a prism main body 90, a light source 92, and a housing 84 accommodating the prism main body 90 and the light source 92. The prism main body 90 of the prism mechanism P is configured as what is called a rectangular prism (right angled triangle in side view) having a reflective surface 90a inclined by an angle of approximately 45 degrees in side view.

As depicted in FIG. 5A, the housing 84 is formed with a first passage port 85a at a position obliquely 45 degrees above the reflective surface 90a, or a position above the prism main body 90. The reflective surface 90a faces the holding table 27 through the first passage port 85a.

The housing 84 is formed with a second passage port 85b at a position obliquely 45 degrees below the reflective surface 90a, or a position on a lateral side relative to the prism main body 90. As depicted in FIG. 5A, light H1 entering through the first passage port 85a is reflected on the reflective surface 90a and refracted by 90 degrees, to be emitted from the second passage port 85b.

Figure 5B:
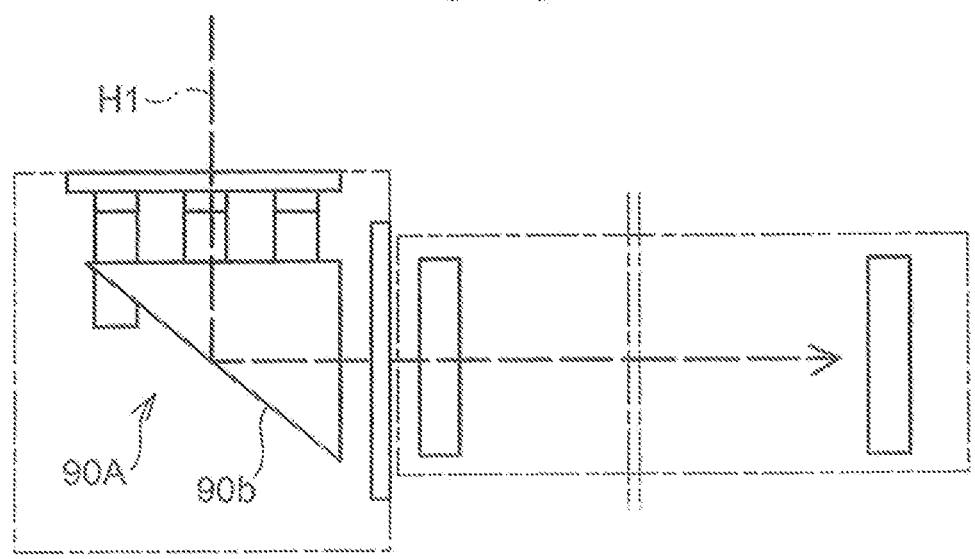
FIG. 5B is a side view depicting another embodiment of a prism main body.

Note that, instead of direct reflection of the light H1 on the reflective surface 90a, as in the prism main body 90 depicted in FIG. 5A, the light H1 may be transmitted through the prism main body 90A and refracted on the reflective surface 90b, as in a prism main body 90A depicted in FIG. 5B. In this case, the optical length can be formed longer, and a design for avoiding interference between component parts or the like is possible.

As depicted in FIGS. 5A and 6, the light source 92 including, for example, a light emitting diode (LED) is accommodated in the housing 84, and a light transmission port 86 for transmitting light of the light source 92 is formed in an upper surface of the housing 84. In the present embodiment, three light sources 92 are disposed on either side of the prism main body 90, and the light transmission ports 86 are formed at positions corresponding to the light sources 92.

As depicted in FIG. 6, the light H2 applied from the light sources 92 is applied toward a lower surface of the wafer W held on the holding table 27 disposed on the upper side, and the reflected light H1 is incident on the prism main body 90. Note that the light sources 92 are disposed in an inclined state such that the applied light H2 illuminates a focal point position of the imaging camera C (FIG. 5A), and such that the optical axes of the light H2 are inclined.

As depicted in FIG. 5A, the imaging camera C includes a lens-barrel 91, an objective lens 93 provided on one end side of the lens-barrel 91, and an imaging element 95 provided on the other end side of the lens-barrel 91. The lens-barrel 91 is provided to be connected to the second passage port 88b, and the objective lens 93 is disposed such as to face the reflective surface 90a of the prism main body 90. The light H1 transmitted through the objective lens 93 is received by the imaging element 95 and is turned into image data by an image processing device not depicted.

As depicted in FIG. 3B, the prism mechanism P and the imaging camera C constituting the lower imaging mechanism 82 are supported by the support plate 94, and a base end part of the support plate 94 is fixed to the Z-axis moving block 98. The column 96 erected on the Y-axis moving block 83 (FIG. 3A) is provided with Z-axis moving means 104 including a ball screw 100 and a pulse motor 102, the Z-axis moving block 98 is moved in the Z-axis direction (vertical direction) along a pair of guide rails 106, and attendant on this, the lower imaging mechanism 82 is also moved in the Z-axis direction (vertical direction).

Figure 10:
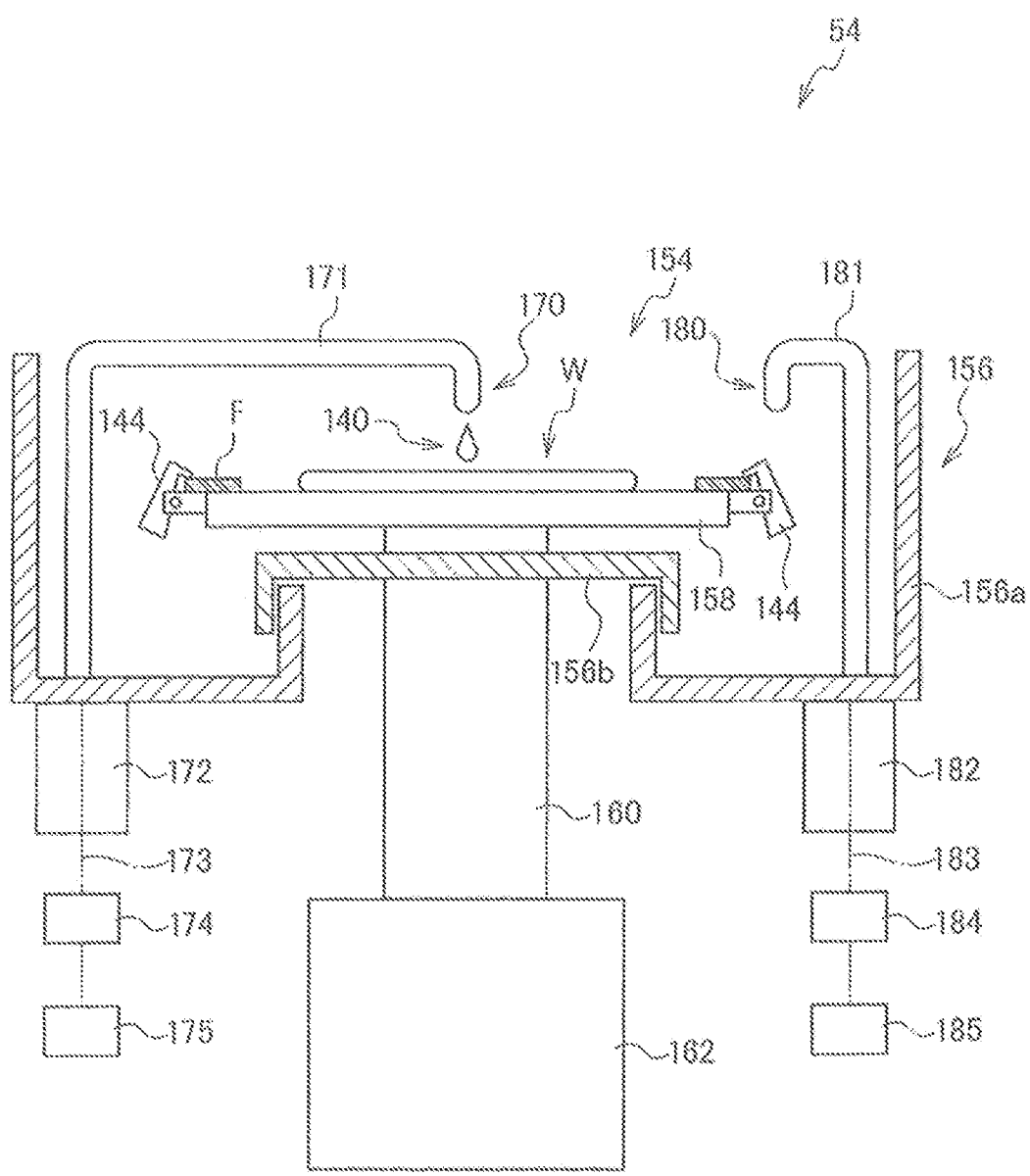
FIG. 10 is a partially sectional side view of a spinner cleaning unit.

FIG. 10 is a partially sectional side view of the spinner cleaning unit 54 for cleaning the wafer W. The spinner cleaning unit 54 includes a spinner table mechanism 154, and a liquid receiving mechanism 156 disposed to surround the spinner table mechanism 154.

The spinner table mechanism 154 includes a spinner table (holding table) 158 that suction holds the wafer W, a support member 160 that supports the spinner table 158, and an electric motor 162 that rotationally drives the spinner table 158 through the support member 160.

Figure 7B:
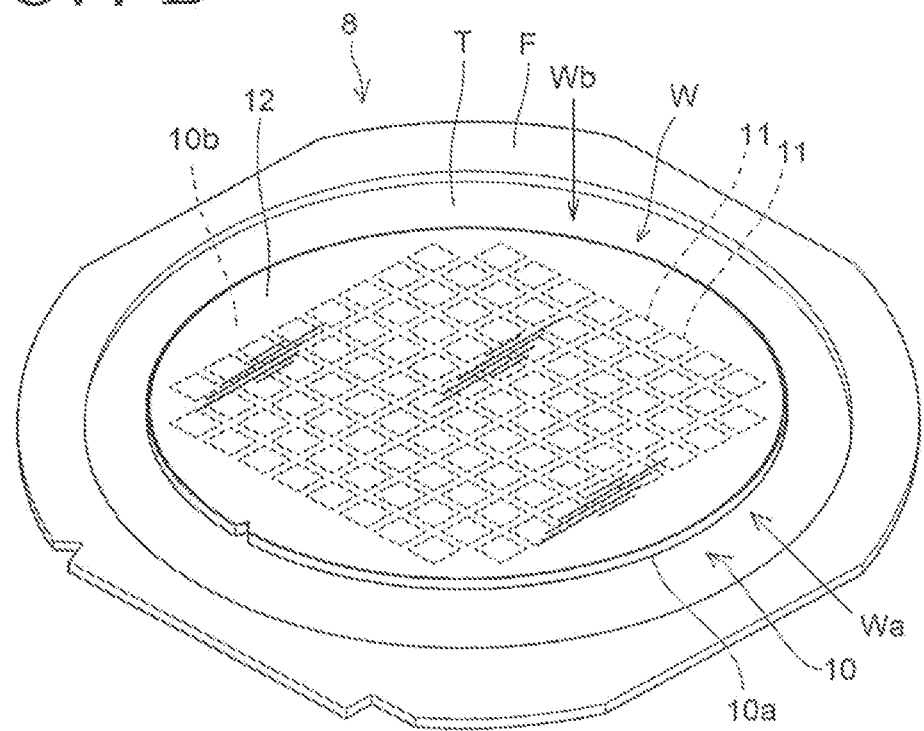
FIG. 7B is a perspective view depicting a back surface of the wafer as an example of the workpiece.

The spinner table 158 is provided with clamps 144, and, when the spinner table 158 is rotated, the clamps 144 are swung by centrifugal forces, to clamp and hold the annular frame F depicted in FIG. 7B.

The liquid receiving mechanism 156 includes a liquid receiving vessel 156a and a cover member 156b that is mounted to the support member 160 and is configured to receive a liquid such as a cleaning liquid and to drain a waste liquid through a drain passage not depicted.

A cleaning liquid ejection nozzle 170 for ejecting a cleaning liquid 140 is provided in a space surrounded by the liquid receiving vessel 156a. The cleaning liquid ejection nozzle 170 is formed at a tip end of a substantially L-shaped arm 171, and the other end of the arm 171 is swung by an electric motor 172. The arm 171 is connected to a cleaning liquid supply source 175 through a cleaning liquid supply passage 173 and an on-off control valve 174. The cleaning liquid 140 is, for example, pure water. Further, a dry air jetting nozzle 180 for jetting dry air is provided in the space surrounded by the liquid receiving vessel 156a.

The dry air jetting nozzle 180 is formed at a tip end of a substantially L-shaped arm 181, and the other end of the arm 181 is swung by an electric motor 182. The arm 181 is connected to a dry air supply source 185 through a dry air supply passage 183 and an on-off control valve 184.

In the spinner cleaning unit 54 configured as above, first, the cleaning liquid ejection nozzle 170 is positioned on an upper side of the wafer W, the wafer W is rotated at a predetermined speed, and the cleaning liquid 140 is ejected toward the wafer W, to perform spin cleaning. After the spin cleaning is conducted, the dry air jetting nozzle 180 is positioned on an upper side of the wafer W, the wafer W is rotated at a predetermined speed, and dry air is blown toward the wafer W, to perform spin drying.

Next, an example of processing by use of the above-mentioned apparatus configuration will be described.

<Workpiece Preparation Step>

This step is a step of adhering a tape transparent to visible light to a front surface of a workpiece. FIG. 7A depicts the wafer W as an example of workpiece. The wafer W has, for example, a metal film 12 as an electrode or a die bond material formed on a back surface 10b of a substrate 10 including a semiconductor.

As depicted in FIG. 7A, devices 11 are arranged in a grid pattern on a front surface 10a of the substrate 10 constituting the wafer W, and cutting is conducted along streets 13, whereby the wafer W is divided into chips. The substrate 10 is, for example, an SiC wafer of a thickness of 100 μm.

FIG. 7B depicts the back surface side of the wafer W, and the metal film 12 is formed on the back surface 10b of the substrate 10 constituting the wafer W. The material, structure, thickness, and the like of the metal film 12 are not particularly limited. For example, a laminate structure of titanium and copper, a laminate structure of nickel, platinum and gold, a laminate structure of nickel and gold, a monolayer structure of silver, or the like may be adopted.

In addition, as depicted in FIG. 7B, the metal film 12 is exposed on the upper side, and the front surface Wa of the wafer W is adhered to a tape T, to constitute a wafer unit 8 in which the annular frame F and the wafer W are united through the tape T.

With the wafer unit 8 as configured above, a state in which the wafer W can be handled while devices 11 on the front surface Wa are protected using the tape T is obtained. Note that a tape may be adhered to the front surface Wa of the wafer W to protect the devices 11 on the front surface Wa, without using the annular frame F.

In addition, in FIG. 7B, the tape T is transparent, that is, has such a characteristic as "to transmit, but not to absorb or scatter, light of at least a part of wavelengths of visible light," and permits the street position detection step described later to be carried out. Besides, the tape T may be a colored one, and may include an expandable resin-made tape. In addition, instead of using the tape T, the front surface Wa of the wafer W may be protected by a plate-shaped hard plate of glass, resin, or the like, for handling.

Note that, as the workpiece, those which are not formed with the metal film 12 may also be objects. In other words, the present invention is widely appropriately adoptable for applications in which the streets on the front surface Wa are imaged while the front surface Wa where the devices 11 are formed is protected by having the tape T adhered thereto.

<Holding Step>

As depicted in FIG. 8, this step is a step of holding the front surface Wa side of the wafer W by the holding table 27 having the holding member 74 of which at least a part is transparent, through the tape T. The wafer W is suction held by the holding member 74 of the holding table 27 through the tape T. The tape T and the holding member 74 are configured to be transparent as mentioned above.

<Street Position Detection Step>

As depicted in FIG. 8, this step is a step of imaging the front surface Wa of the wafer W held by the holding table 27 through the holding member 74 and the tape T by the imaging camera C (FIG. 5A) to detect the position of the street 13 (FIG. 7A), after the holding step is carried out.

Specifically, as depicted in FIG. 8, the Y-axis moving block 83 is moved, whereby the lower imaging mechanism 82 is positioned on a lower side of the wafer W, the front surface Wa of the wafer W is imaged through the holding member 74 of the holding table 27 and the tape T, and the street 13 (FIG. 7A) of the wafer W is detected based on the picked-up image.

<Cutting Step>

Figure 11A:
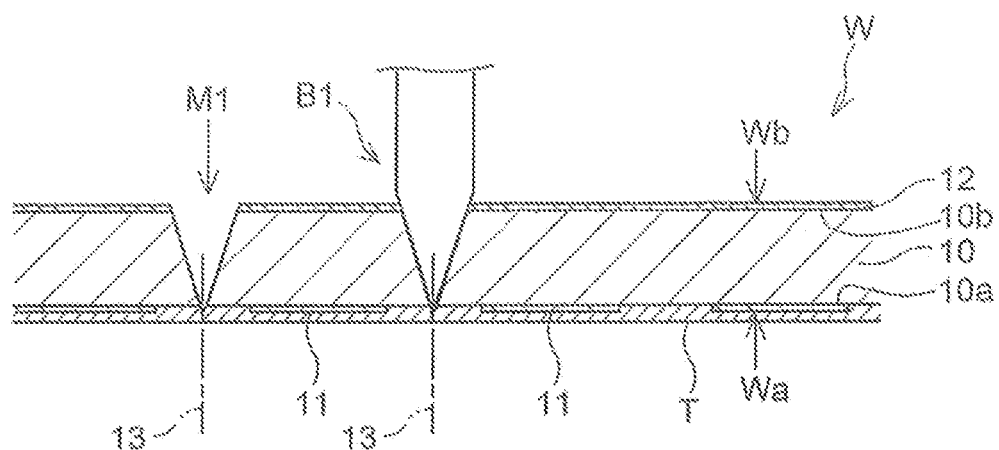
FIG. 11A is a sectional view depicting the cutting step for forming V-shaped grooves.
Figure 11B:
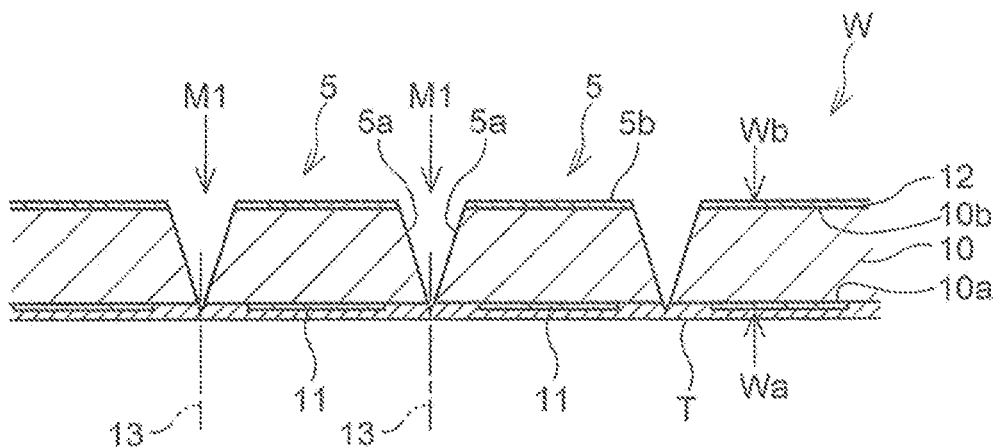
FIG. 11B is a sectional view depicting the manner in which the wafer is divided into chips by the cutting step.

As depicted in FIGS. 11A and 11B, this step is a step of cutting the workpiece (wafer W) along the streets 13 by a cutting blade B1 having a V-shaped tip end, to form grooves M1 of which shallower parts are wider than deeper parts, after the street position detection step is carried out.

Specifically, as depicted in FIG. 9, the position of the cutting blade B1 of the cutting unit 46 is adjusted to the position of the street 13 (FIG. 7A) detected by the street position detection step, the cutting unit 46 is positioned at a predetermined height, and the holding table 27 is moved in a processing feeding direction (X-axis direction), to perform cutting.

After cutting of one street 13 (FIG. 7A) is conducted, as depicted in FIG. 9, the cutting blade B1 is subjected to indexing feeding in the Y-axis direction, and similar cutting of the adjacent street is performed. After the cutting of all the streets 13 extending in a first direction in FIG. 7A is conducted, the holding table 27 (FIG. 9) is rotated by 90 degrees, and similar cutting in a second direction in FIG. 7A is performed.

By the above-mentioned cutting, in the example depicted in FIGS. 11A and 11B, the V-shaped grooves M1 of which shallower parts are wider than deeper parts are formed, and full-cutting is conducted such that the grooves M1 penetrate the wafer W to reach the tape T. As a result, a state in which chips 5 are formed on both sides of the groove M1 is obtained, and side surfaces 5a of each of the chips 5 are inclined surfaces.

Figure 12A:
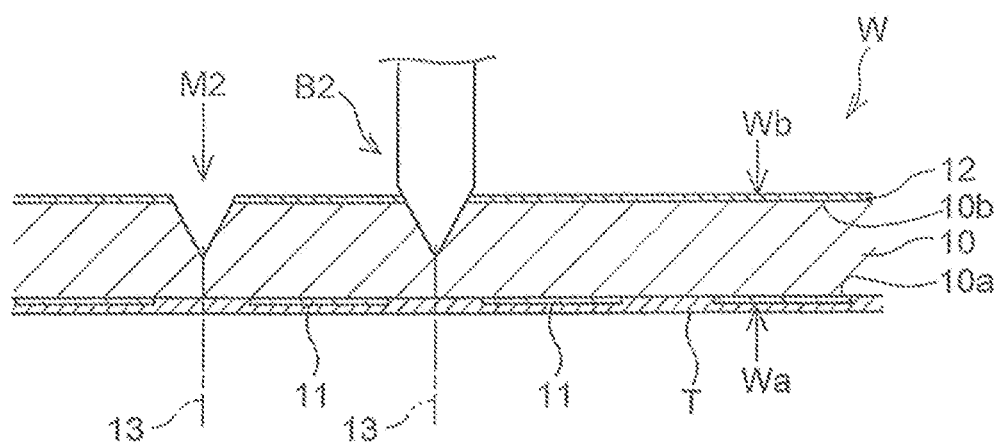
FIG. 12A is a sectional view depicting the cutting step for forming the V-shaped grooves.
Figure 12B:
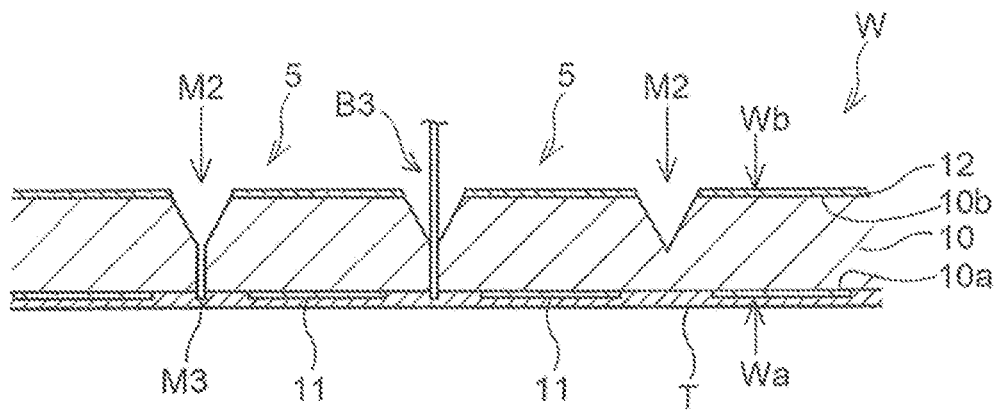
FIG. 12B is a sectional view depicting the manner of full-cutting for forming rectilinear grooves.

Note that, as depicted in FIGS. 12A and 12B, a process may be adopted in which, as a first cutting step, half-cutting of cutting the wafer W along the streets 13 by a cutting blade B2 having a V-shaped tip end, to form V-shaped grooves M2 is conducted, and, as a second cutting step, full-cutting of cutting the residual part by a cutting blade B3 having a rectilinear tip end, to form rectilinear grooves M3 is conducted.

Also, by the mode of step cutting in which cutting is conducted stepwise in this way, the V-shaped grooves M2 of which shallower parts are wider than deeper parts can be configured. Note that in this case, a cutting apparatus having two cutting blades is used in place of the cutting apparatus 2 depicted in FIG. 1.

<Cleaning Step>

Figure 13:
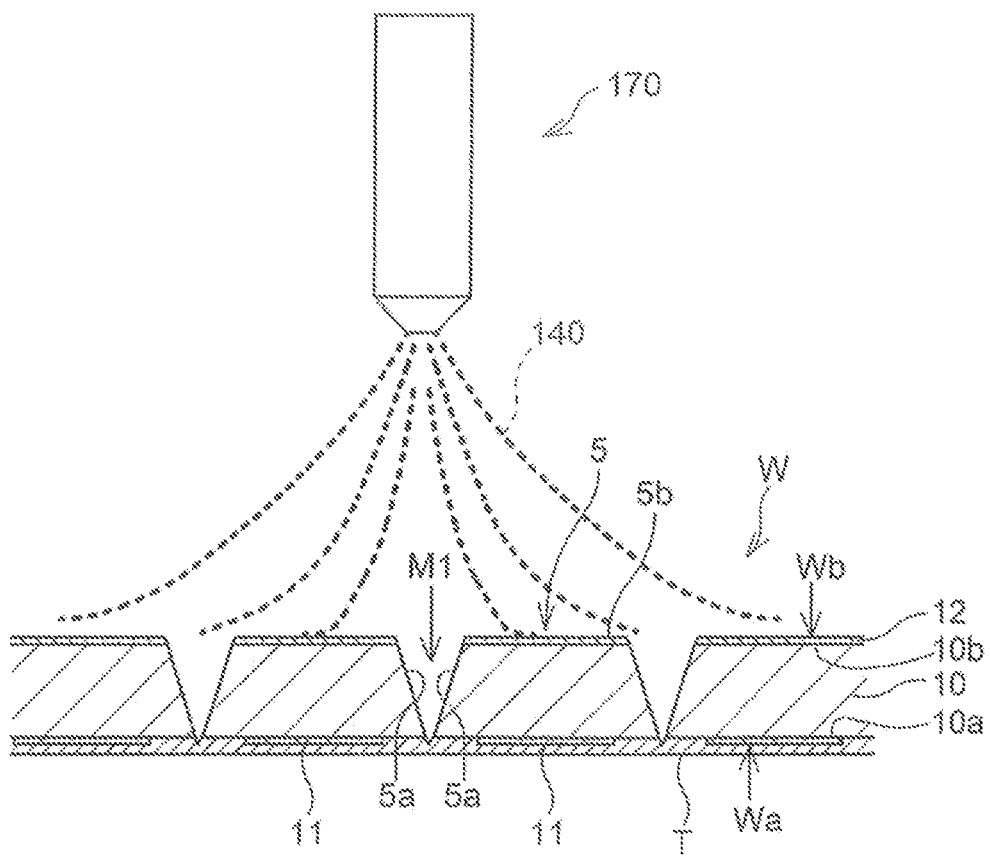
FIG. 13 is a partially sectional side view depicting a cleaning step.

As depicted in FIG. 13, this step is a step of supplying the cleaning liquid 140 to the back surface Wb of the wafer W to clean the workpiece, after the cutting step is carried out. In this cleaning, since the grooves M1 are V-shaped in section, the cleaning liquid 140 easily enter into the grooves M1, so that cutting swarf entered in the grooves M1 can be securely washed away, and the cutting swarf can be prevented from remaining on the side surfaces 5a and back surfaces 5b of the chips 5.

According to the abovementioned embodiment, as depicted in FIG. 13, since the grooves M1 of which shallower parts are wider than deeper parts are formed, the cleaning liquid 140 easily enters into the grooves M1 in the cleaning step, so that the cutting swarf having entered into the grooves M1 can be securely washed away, and the cutting swarf can be prevented from remaining on the side surfaces 5a and back surfaces 5b of the chips 5. In addition, a state in which the cutting liquid having entered into the grooves M1 is easily discharged together with the cutting swarf can be realized.

The present invention is not limited to the details of the above described preferred embodiments. The scope of the invention is defined by the appended claim and all changes and modifications as fall within the equivalence of the scope of the claim are therefore to be embraced by the invention.

What is claimed is:

1. A processing method for a workpiece having a front surface formed with devices respectively in regions partitioned by a plurality of intersecting streets, the processing method comprising:
a workpiece preparation step of adhering a tape transparent to visible light to the front surface of the workpiece;
a holding step of holding the front surface side of the workpiece through the tape by a holding table having a holding member of which at least a part is transparent;
a street position detection step of imaging the front surface of the workpiece held by the holding table through the holding member and the tape by an imaging camera to detect a position of the street, after the holding step is carried out;
a cutting step of cutting a back surface of the workpiece along the streets by a cutting blade having a V-shaped tip end, to form V grooves of which shallower parts are wider than deeper parts, after the street position detection step is carried out; and
a cleaning step of cleaning the back surface of the workpiece with a cleaning liquid, after the cutting step is carried out.

* * * * *